(12) United States Patent
Stanley et al.

(10) Patent No.: US 10,712,791 B1
(45) Date of Patent: Jul. 14, 2020

(54) PHOTOVOLTAIC POWERED THERMAL MANAGEMENT FOR WEARABLE ELECTRONIC DEVICES

(71) Applicant: MICROSOFT TECHNOLOGY LICENSING, LLC, Redmond, WA (US)

(72) Inventors: Gavin D. Stanley, Puyallup, WA (US); Sridhar Canumalla, Sammamish, WA (US); Douglas L. Heirich, Palo Alto, CA (US); Sravan Kuman Reddy Gondipalli, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/570,825

(22) Filed: Sep. 13, 2019

(51) Int. Cl.
| | | |
|---|---|---|
| *G06F 1/20* | (2006.01) | |
| *G06F 1/16* | (2006.01) | |
| *G02B 27/01* | (2006.01) | |
| *H01L 51/44* | (2006.01) | |
| *H01L 35/32* | (2006.01) | |
| *H01L 31/048* | (2014.01) | |

(52) U.S. Cl.
CPC ......... *G06F 1/206* (2013.01); *G02B 27/0176* (2013.01); *G06F 1/163* (2013.01); *G06F 1/1635* (2013.01); *G06F 1/203* (2013.01); *H01L 31/048* (2013.01); *H01L 35/32* (2013.01); *H01L 51/441* (2013.01)

(58) Field of Classification Search
CPC combination set(s) only.
See application file for complete search history.

(56) References Cited

U.S. PATENT DOCUMENTS 5,072,209 A * 12/1991 Hori ................. A42B 3/042
340/432
5,708,449 A * 1/1998 Heacock ............ G02B 7/12
345/7

(Continued)

FOREIGN PATENT DOCUMENTS

| CN | 104391376 A | 3/2015 |
|---|---|---|
| JP | 2014178600 A | 9/2014 |
| WO | 2018056981 A1 | 3/2018 |

*Primary Examiner* — Lisa Lea-Edmonds
(74) *Attorney, Agent, or Firm* — Newport IP, LLC; Mike R. Cicero

(57) ABSTRACT

Techniques disclosed herein relate to exploiting photovoltaic effects to improve the thermal management capabilities for wearable electronic devices. In an exemplary embodiment, a wearable electronic device includes photovoltaic cells disposed over a housing assembly that encloses heat-emitting electronic components. The photovoltaic cells block solar radiation from reaching an exterior surface of the housing assembly—thereby reducing the solar gain thereof. Electrical energy that is generated by the photovoltaic cells is utilized in some manner that is determined to be currently appropriate based on various current-state factors of the wearable electronic device. For example, the wearable electronic device may include a thermal management engine that modulates the flow of current from the photovoltaic cells based on a current power demand of the wearable electronic device, a current charge level of a battery of the wearable electronic device, and/or a current temperature at one or more sensors of the wearable electronic device.

20 Claims, 7 Drawing Sheets

(56) References Cited

U.S. PATENT DOCUMENTS

| | | | | |
|---|---|---|---|---|
| 5,796,374 | A * | 8/1998 | Cone | G02B 27/0176 345/8 |
| 5,844,530 | A * | 12/1998 | Tosaki | G02B 27/017 345/8 |
| 6,032,291 | A * | 3/2000 | Asenguah | A42B 1/008 2/171.3 |
| 6,167,413 | A * | 12/2000 | Daley, III | G02B 27/017 345/8 |
| 6,448,944 | B2 * | 9/2002 | Ronzani | G02B 27/017 345/7 |
| 8,643,568 | B2 * | 2/2014 | West | G02B 27/0176 345/8 |
| 8,757,831 | B2 * | 6/2014 | Waters | A42B 1/244 362/106 |
| 9,128,281 | B2 | 9/2015 | Osterhout et al. | |
| 9,274,340 | B2 * | 3/2016 | Lyons | G06F 3/011 |
| 9,442,563 | B2 * | 9/2016 | Mullen | G06F 1/1624 |
| 9,448,405 | B2 * | 9/2016 | Yamamoto | G02B 27/017 |
| 9,585,285 | B2 * | 2/2017 | Nikkhoo | H05K 7/20127 |
| 9,703,103 | B2 * | 7/2017 | Araki | G09G 5/00 |
| 9,733,480 | B2 * | 8/2017 | Baek | H05K 5/0004 |
| 9,740,239 | B2 * | 8/2017 | Pombo | G02B 27/0149 |
| 9,857,839 | B1 * | 1/2018 | Bristol | G06F 1/163 |
| 9,989,998 | B1 * | 6/2018 | Yee | G06F 1/163 |
| 10,241,331 | B2 * | 3/2019 | Yamamoto | G02B 27/017 |
| 10,281,728 | B2 * | 5/2019 | Miller | G02B 27/0176 |
| 10,459,236 | B2 * | 10/2019 | Lee | G02B 27/0176 |
| 10,528,081 | B2 * | 1/2020 | Wong | A41D 1/002 |
| 10,571,691 | B1 * | 2/2020 | Yee | G06F 1/1613 |
| 2002/0186180 | A1 * | 12/2002 | Duda | A42B 1/245 345/8 |
| 2006/0028400 | A1 | 2/2006 | Lapstun et al. | |
| 2013/0214998 | A1 | 8/2013 | Andes et al. | |
| 2017/0115742 | A1 | 4/2017 | Xing et al. | |
| 2020/0018962 | A1 * | 1/2020 | Lu | G02B 27/0176 |

\* cited by examiner

PHOTOVOLTAIC POWERED THERMAL MANAGEMENT FOR WEARABLE ELECTRONIC DEVICES

BACKGROUND

Solar gain causes significant thermal management challenges for wearable electronic devices such as, for example, head-mounted display (HMD) devices that are exposed to solar radiation during operation. For example, in wearable electronic devices having a housing that encloses heat-emitting electronic components, the housing itself serves the thermal management function of passively dissipating some, or even all, of the heat that is internally emitted by the enclosed electronic components. When operating under indoor and/or nighttime conditions, solar gain may have little or no effect on the rate at which the housing passively dissipates the heat emitted by the electronic components into the surrounding environment. However, when operating under outdoor and daytime conditions, solar gain significantly impairs this heat transfer rate since the absorption of incident solar radiation continually increases the thermal energy of the housing.

The rate at which the housing experiences solar gain due to sun exposure directly reduces the rate at which the housing is able to passively dissipate heat that is emitted within the housing. In some cases, solar gain may prevent a wearable electronic device from dissipating internally emitted heat at a fast-enough rate to maintain allowable temperatures. For example, many electronic devices are designed continually measure internal temperatures and to throttle performance or even automatically shut down if these measured temperatures exceed predefined threshold. Thus, solar gain can significantly impair the performance of wearable electronic devices and, in some cases, can even render such devices inoperable due to extreme temperatures.

It is with respect to these and other considerations that the disclosure made herein is presented.

SUMMARY

Technologies described herein provide photovoltaic based thermal management techniques for wearable electronic devices such as head-mounted display (HMD) devices. Generally described, the techniques disclosed herein utilize photovoltaic cells to reduce solar gain experienced by a housing assembly that encloses heat-emitting electronic components of a wearable electronic device. As described below, an exemplary wearable electronic device includes a housing assembly through which internally emitted heat is continually dissipated. For example, as heat is emitted by electronics enclosed within the housing assembly, some or all of this heat is absorbed into the housing assembly and then dissipated into an external environment (e.g., via radiation and/or convection). As further described below, the exemplary wearable electronic device also includes an arrangement of photovoltaic cells disposed over an exterior surface of the housing assembly to reduce the solar gain thereof. In particular, when the wearable electronic device is exposed to solar radiation during operation (e.g., when used in direct sunlight), some fraction of the photon energy from this solar radiation is converted into useful electricity—rather than thermal energy.

By converting some fraction of photon energy into useful electricity rather than thermal energy, the photovoltaic cells disposed over the exterior region of the housing assembly reduce the solar gain (also referred to as "solar heat gain") experienced by the housing assembly. As used herein, the terms "solar gain" and "solar heat gain" refer specifically to an increase in thermal energy of an object that results from solar radiation being absorbed into the object. For example, as the housing assembly is struck by sunlight, it will absorb some portion of the sunlight's visible and short-wave components—the result being an increase in the overall thermal energy of the housing assembly. Then, the housing assembly will dissipate the thermal energy resulting from solar gain by convective heat transfer (e.g., into the air surrounding the housing assembly) and/or by re-radiating this heat outward.

Maintaining allowable temperatures at the housing assembly requires dissipating thermal energy at least as quickly as it is being absorbed both externally from solar radiation and internally from computing electronics. Since the passive heat dissipation capabilities of any particular object are inherently limited (e.g., by the emissivity of the object, the thermal conductivity of the object, etc.), reducing the effects of solar gain on the housing assembly increases the rate at which the housing is able to passively dissipate heat absorbed internally from heat-emitting electronics. Thus, reducing the solar gain of the housing assembly according to the techniques described herein improves the thermal management capabilities of a wearable electronic device. This improves the performance of the wearable electronic device by mitigating the need to throttle and/or power down the electronics due to extreme internal temperatures. Furthermore, this also protects the user from burns and poor thermal comfort due to extreme external surface temperatures.

The wearable electronic devices disclosed herein may further include a thermal management engine that selectively directs a flow of current from the photovoltaic cells based on various current-state factors of the wearable electronic device. Exemplary current-state factors include, but are not limited to, a current power demand of the electronic components within the wearable electronic device, a current charge level of a battery within the wearable electronic device, and/or a current temperature at one or more sensors of the wearable electronic device. For example, the wearable electronic device may have one or more resistive heating elements disposed at various locations that are remote from the housing assembly. Here, the thermal management engine may monitor current power demand (e.g., measured in Watts) of the electronic components within the housing assembly and may direct a first amount of current from the photovoltaic cells to these electronics to meet this current power demand—thereby reducing the drain on a battery of the wearable electronic device.

Furthermore, if the battery is sufficiently charged, the thermal management engine may direct a second amount of current (e.g., an amount that remains after the power demand of the electronics is met) to the one or more resistive heating elements to generate heat at the various locations that are remote from the housing assembly. In this way, some amount of solar energy that would otherwise have been converted into thermal energy upon striking the housing assembly is instead converted into useful electricity which may be used to power (and/or charge) the wearable electronic device, and/or may be transferred away from the housing assembly prior to being converted into thermal energy and dissipated from the wearable electronic device.

An exemplary embodiment of a wearable electronic device is a head-mounted display (HMD) device that comprises a housing assembly enclosing various computing components that emit heat during operation. Exemplary such computing components include, but are not limited to, central processing units (CPUs), graphics processing units (GPUs), Light Emitting Diodes (LEDs), and/or batteries. The HMD device also comprises a support element that, during operation of the HMD device, maintains the housing assembly at a desired position with respect to a body part of a user. More specifically, the support element may be coupled to the housing assembly to enable the housing assembly to be worn by the user at an appropriate location of the user's body. To illustrate this point, presume that the HMD device further includes a display that is mechanically coupled to the housing assembly and that is deployed to generate imagery within a field-of-view of the user during operation of the HMD device. In such an embodiment, the support element may be usable to mount (e.g., removably attach) the housing assembly to the user's head to maintain the display within the field-of-view of the user.

The HMD device further includes a plurality of photovoltaic cells that are positioned to block solar radiation from an exterior surface of the housing assembly—thereby at least partially reducing the solar gain experienced by the housing assembly. As a specific but non-limiting example, these photovoltaic cells may be crystalline silicon cells that are encapsulated within two or more flexible sheets of transparent material to form a flexible solar sheet. Furthermore, an outer shell of the housing assembly may be a fiber-reinforced polymer. For example, the outer shell may be formed by thermal compression molding a thermosetting epoxy resin impregnated carbon fiber reinforced polymer (CFRP) fabric into a desired substrate shape. In this specific but nonlimiting example, the flexible solar sheet having the crystalline silicon cells encapsulated therein may be adhered directly over the exterior surface of the outer "CFRP" shell (e.g., with epoxy and/or other suitable adhesive) and may conform to the contours of this outer surface.

In some embodiments, the outer shell of the housing assembly includes one or more apertures through which various components of the HMD device protrude and/or collect environmental data. Exemplary such components include, but are not limited to, user input devices (e.g., buttons, etc.), input ports (e.g., USB ports, charging ports, etc.), and/or environmental sensors which collect environmental data associated with an environment surrounding the HMD device (e.g., cameras, Time-of-Flight Sensors, etc.). As a specific but non-limiting example, a button-type user input device may protrude through an aperture to enable a user to control a volume and/or brightness of the HMD device. In such embodiments, the flexible solar sheet that is adhered to the outer shell may include one or more apertures that match a corresponding aperture(s) of the outer shell. That is, the flexible solar sheet may be specifically configured so that photovoltaic cells are located over only regions of the outer shell which lack apertures. In this way, the aperture(s) of the outer shell remain available for components of the HMD device to protrude and/or collect environmental data—even after the flexible solar sheet is disposed thereover.

In some embodiments, the HMD device further includes one or more heating devices that are located remotely from the housing assembly. For example, the HMD device may include a resistive heating element that is located within the support element at some location that is remote from the housing assembly (e.g., 2 inches away from the housing assembly, 4 inches away from the housing assembly, etc.). As another example, the HMD device may include a Thermoelectric cooler (TEC) that is positioned with a cold side located adjacent to a heat source within a housing assembly. In this way, by supplying photovoltaically generated power to the TEC cooler internally emitted heat may be pumped out of the housing assembly. In either case, at least some portion of the electrical current that is generated by the photovoltaic cells may be used to power the heating device. In this way, solar energy which otherwise would have been absorbed into the housing assembly as thermal energy is converted into useful electricity and then transferred away from the housing assembly prior to being converted into thermal energy and dissipated from the wearable electronic device.

These and various other features will be apparent from a reading of the following Detailed Description and a review of the associated drawings. This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with another number included within a parenthetical (and/or a letter without a parenthetical) to refer to each individual item. Generic references to the items may use the specific reference number without the sequence of letters.

DETAILED DESCRIPTION

Figure 1A:
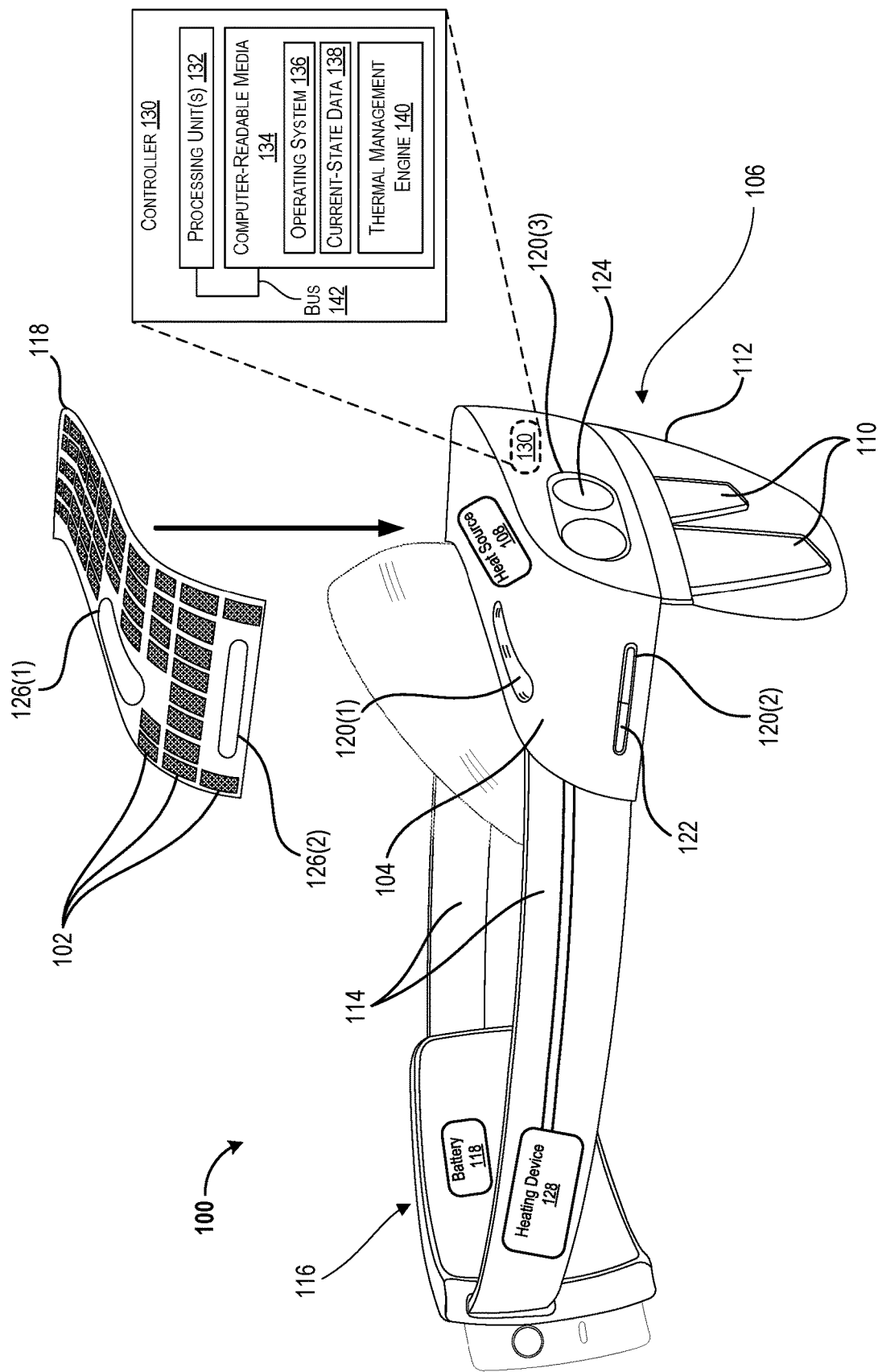
FIG. 1A illustrates an exemplary head-mounted display (HMD) device that is configured with one or more photovoltaic cells in order to exploit photovoltaic effects for improved thermal management capabilities.

This Detailed Description describes techniques for exploiting photovoltaic effects to improve the thermal management capabilities for wearable electronic devices. Generally described, the disclosed techniques utilize photovoltaic devices to reduce the solar gain of the wearable electronic device. For example, photovoltaic cells may be disposed over a housing assembly that encloses some or all electronic components of a wearable electronic device. As heat is emitted by these electronic components, at least some of this heat is absorbed into the housing assembly prior to being dissipated into an external environment. The photovoltaic cells disposed over the housing assembly block solar radiation from reaching an exterior surface of the housing assembly—thereby reducing the solar gain thereof. Thus, when the disclosed wearable electronic devices are exposed to solar radiation (e.g., when operated in direct sunlight), some fraction of the photon energy from this solar radiation is converted into useful electricity—rather than thermal energy. By converting some fraction of photon energy into useful electricity rather than thermal energy, the photovoltaic cells disposed over the exterior region of the housing assembly reduce the solar gain experienced by the housing assembly.

Electrical energy that is generated by the photovoltaic cells may be utilized by the wearable electronic device in some manner that is determined to be currently appropriate based on various current-state factors of the wearable electronic device. For example, the wearable electronic device may include a thermal management engine that modulates the flow of current from the photovoltaic cells appropriately based on a current power demand of the electronic components within the wearable electronic device, a current charge level of a battery within the wearable electronic device, and/or a current temperature at one or more sensors of the wearable electronic device. In a specific example, the thermal management engine may direct just enough electrical current into the housing assembly to meet the immediate power demands of electronic components therein while simultaneously directing any remaining electrical current to a remotely located resistive heating element. In this way, some amount of solar energy that would otherwise have been converted into thermal energy upon striking the housing assembly may be converted into useful electricity—some of which is used to power (and/or charge) the wearable electronic device and some of which is transferred away from the housing assembly prior to being converted into thermal energy and dissipated from the wearable electronic device.

The techniques disclosed herein are widely applicable to a variety of approaches for exploiting photovoltaic effects to improve the thermal management capabilities for wearable electronic devices. Numerous aspects of the techniques disclosed herein are described in the specific context of utilizing photovoltaic cells to reduce solar gain at a housing assembly and to generate electrical current to power thermal devices (e.g., resistive heating elements and/or thermoelectric coolers) in order to improve the thermal dissipation capabilities of a head-mounted display (HMD) device. While the presently disclosed techniques are not necessarily limited to such embodiments, an appreciation of various aspects of the techniques disclosed herein is readily gained through a discussion of examples in this specific context of HMD devices. However, the disclosed techniques are applicable to dissipating heat from smart watches, chest-mounted fitness monitors, and other types of wearable electronic devices.

Figure 1B:
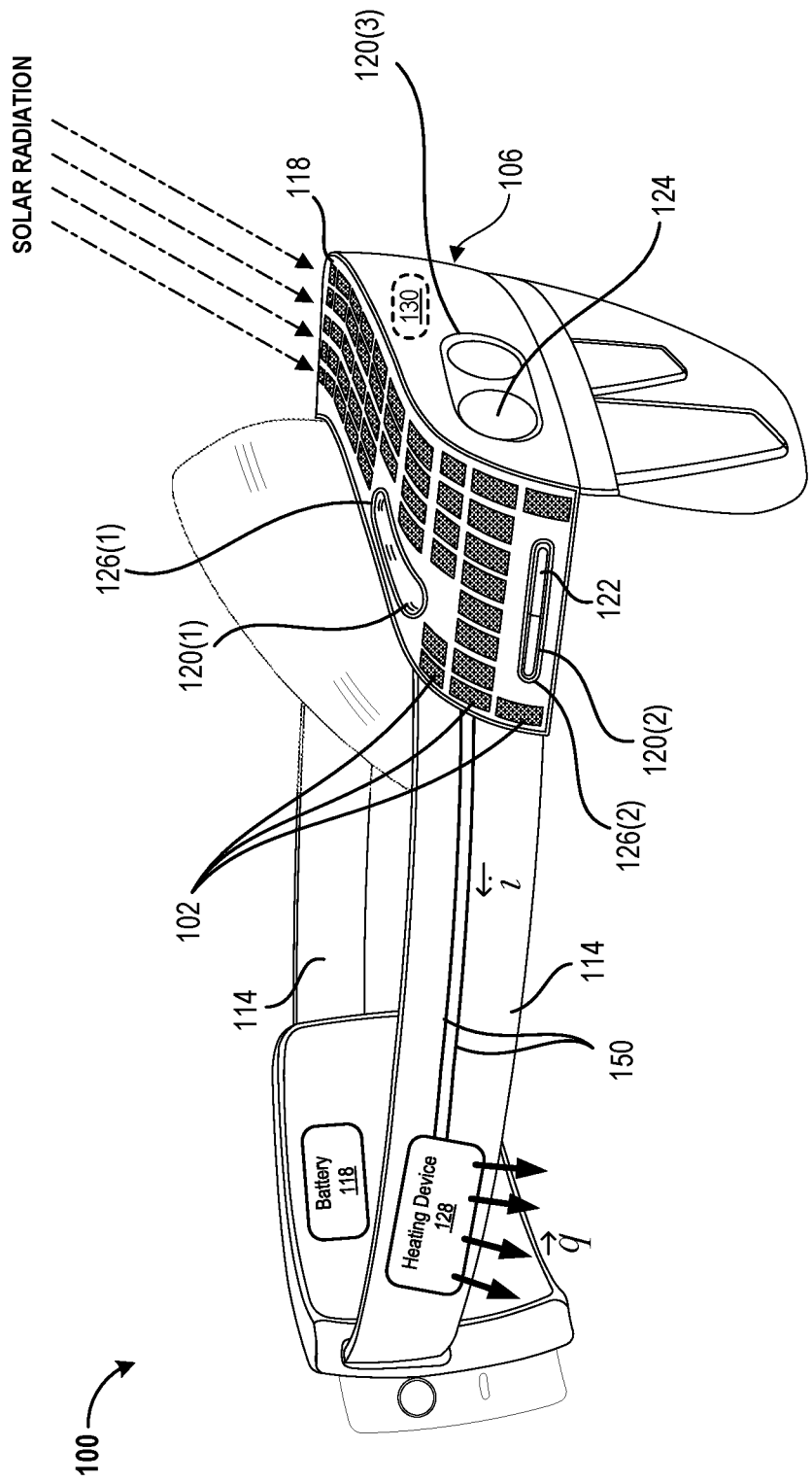
FIG. 1B illustrates the exemplary HMD device of FIG. 1A after a flexible solar sheet has been adhered directly to an outer surface of a housing assembly thereof.

Turning now to FIG. 1A, illustrated is an exemplary HMD device 100 that is configured to exploit photovoltaic effects for improved thermal management capabilities. In the illustrated example, the HMD device 100 includes one or more photovoltaic cells 102 for blocking solar radiation from an outer shell 104 of a housing assembly 106. These photovoltaic cells 102 also generate electric energy which may be used for powering a heating device 128 that is located remotely from the housing assembly 106. Additionally, or alternatively, electricity generated by the photoelectric cells 102 may be used for powering electronic components enclosed within the housing assembly 106 and/or for charging a battery of the HMD device 100. In order to visually expose the housing assembly 106 in FIG. 1A, the photovoltaic cells 102 are shown above the housing assembly 106—e.g., in an exploded fashion. As shown in FIG. 1B, however, in final form the photovoltaic cells 102 may be disposed directly against the housing assembly 106.

In this example, the outer shell 104 of the housing assembly 106 at least partially encloses a heat source 108 such as, for example, a central processing unit, a graphics processing unit, and/or a battery. The HMD device 100 may further include various other components such as speakers, microphones, accelerometers, gyroscopes, magnetometers, temperature sensors, touch sensors, biometric sensors, other image sensors, energy-storage components (e.g. battery), a communication facility, a GPS receiver, etc.

In some embodiments, the outer shell 104 of the housing assembly 106 may be a fiber-reinforced polymer. For example, the outer shell 104 may be formed by thermal compression molding a thermosetting epoxy resin impregnated carbon fiber reinforced polymer (CFRP) fabric into a desired substrate shape. The illustrated HMD device 100 further includes a display 110 to generate images in front of a user's eye(s) for augmented reality (AR) and/or virtual reality (VR) applications. In embodiments where the HMD device 100 is usable for AR applications, the display 110 may be a transparent display element that enables the user to view the real-world environment while concurrently viewing AR content (e.g., computer generated images). In embodiments where the HMD device 100 is usable for VR applications, the display 110 may be an opaque display element that replaces the user's view of the real-world environment with VR content (e.g., computer generated images). The illustrated HMD device 100 further includes a transparent visor 112 for protecting the display component 110 and/or for protecting the user's eyes when the HMD device 100 is being worn by the user during operation.

As illustrated, the HMD device 100 also includes one or more support elements 114 that are configured to maintain the housing assembly 106 at a particular position with respect to a body part of the user during operation. Here, the support elements 114 are coupled to the housing assembly 106 in a specific manner that enables the HMD device 100 to be worn by the user. More specifically, the support elements 114 are usable to mount the housing assembly 106 to the user's head at a location so as to maintain the display 110 within the field-of-view of the user.

In some embodiments, the one or more support elements 114 are further coupled to a secondary housing assembly 116 of the HMD device 100. Similar to the housing assembly 106, the secondary housing assembly 116 may at least partially encloses one or more other heat sources. As illustrated, the secondary housing assembly 116 encloses a battery 118 that supplies electrical power to the various electronic components of the HMD device 100. The battery 118 may of course act as a heat source whenever it is being charged and/or discharged, e.g., while supplying power to the HMD device 100. It will be appreciated that when properly worn during operation, the housing assembly 106 may be securely mounted to the front of a user's head whereas the secondary housing assembly 116 may be securely mounted to the rear of the user's head.

In some embodiments, the photovoltaic cells 102 may be integrated into a flexible solar sheet 118 that is adhered to the outer shell 104 of the housing assembly 106 during manufacturing of the HMD device 100. As a specific example, these photovoltaic cells 102 may be crystalline silicon cells that are encapsulated within two or more flexible sheets of transparent material to form the flexible solar sheet 118. In this specific but nonlimiting example, the flexible solar sheet 118 having the crystalline silicon cells encapsulated therein may be adhered directly over the exterior surface of the outer shell 104 (e.g., with epoxy and/or other suitable adhesive) and may conform to the contours thereof. As another specific example, the photovoltaic cells 102 may be comprised of one or more organic photovoltaic materials that are placed in electrical contact with one or more graphene electrode sheets. As shown in FIG. 1B, when adhered to the outer shell 104, the photovoltaic cells 102 at least partially block solar radiation from an exterior surface of the outer shell 104—thereby at least partially reducing the solar gain experienced by the housing assembly 106. It will be appreciated that the extent to which the photovoltaic cells 102 reduce the solar gain experienced by the housing assembly 106 will be largely dependent on the power conversion efficiency (PCE) of the photovoltaic cells 102. As used herein, the term "power conversion efficiency" refer specifically to the fraction of incident solar power that is converted by the photovoltaic cells 102 into useful output electrical power. For example, under circumstances in which 10 Watts of solar power strikes the photovoltaic cells 102 and 2 Watts of useful electrical power is output by the photovoltaic cells 102, the PCE would be 0.2 or 20%.

In some embodiments, the outer shell 104 of the housing assembly 106 includes various apertures 120. It will be appreciated that such apertures may serve a variety of functions in a typical wearable electronic device such as, for example, the exemplary HMD device 100. In the illustrated example, the outer shell 104 includes a first aperture 120(1) that serves as an orifice to induce airflow for the purpose of improving convective heat transfer from the housing assembly 106. In this example, therefore, it should be appreciated that blocking the first aperture 120(1) would adversely affect the thermal performance of the HMD device 100. Also, in the illustrated example, the outer shell 104 includes a second aperture 120(2) through which a user input device 122 protrudes. Here, the user input device 122 is illustrated in the form of two side-by-side buttons which a user can depress to provide commands to the HMD device 100. For example, the user can depress the buttons to control a volume and/or brightness of the HMD device 100. Also, in the illustrated example, the outer shell includes a third aperture 120(3) through which an environmental sensor 124 observes a surrounding environment to collect environmental data associated there with. For example, the environmental sensor 124 may be a camera and/or time-of-flight sensor that collects environmental data for use by the HMD device 100.

It should be appreciated that blocking individual ones of the apertures 120 will impair the intended functionality thereof. For this reason, in those embodiments in which the outer shell 104 of the housing assembly 106 includes apertures 120, the flexible solar sheet 118 that is ultimately adhered to the outer shell 104 may include one or more apertures 126 that uniquely correspond to individual ones of the apertures 120. Stated more plainly, the flexible solar sheet 118 may be specifically configured so that the photovoltaic cells 102 are located over only regions of the outer shell 104 which lack apertures. In this way, the aperture(s) 120 of the outer shell 104 remain available for components of the HMD device 100 to protrude and/or collect environmental data—even after the flexible solar sheet 118 is disposed thereover.

In some embodiments, the HMD device 100 may further include a heating device 128 that is located remotely from the housing assembly 106. As illustrated, the heating device 128 is located remotely from the housing assembly 106 and is an integral component of the support assembly 114. For purposes of the present discussion, presume that the heating device 128 is a resistive heating element that performs Joule heating when supplied with electrical current. In various embodiments, at least some electrical current that is generated by the photovoltaic cells 102 is supplied to the heating device 128 for the specific purpose of converting electrical energy into thermal energy at a location of the HMD device 100 that is remote from the housing assembly 106. In this way, some amount of incident solar energy which would have been absorbed by the housing assembly 106 in the form of thermal energy is instead converted into electrical energy that is transferred away from the housing assembly 106 to the "remotely located" heating device 128. At least some of this electrical energy that is transferred away from the housing assembly 106 may then be converted into thermal energy by the heating device 128. It will be appreciated that by exploiting photovoltaic effects to first absorb energy from the sun in the form of electrical energy and then transfer this electrical energy away from the housing assembly 106 before ultimately converting it into thermal energy for dissipation from the HMD device 100 serves to at least partially reduce the solar gain experienced by the housing assembly 106—the result being reduced operational temperatures at the housing assembly 106.

As used herein, term "remote" when used in the sense of a first component being "remotely located" from a second component means that the first component is separated in space from the second component. For example, an electric heating element that is integrated into a support element at a location such that it is noncontiguous (e.g., not touching) a housing assembly may be aptly referred to as being "remote" from the housing assembly.

In the illustrated example, the HMD device 100 is equipped with a controller 130 that operates a thermal management engine 140 to manage how electrical power is distributed from the photovoltaic cells 102 to various components of the HMD device 100. The thermal management engine 140 may periodically and/or continually determine how to distribute photovoltaically generated power based on current state data 138 that indicates characteristics of a current state of the HMD device 100. As illustrated, the controller 130 comprises one or more processing units 132 and one or more computer-readable media 134 for storing an operating system 136 that supports various functions of the HMD device 100 such as, for example, scheduling tasks, executing applications, and/or controlling peripherals. The computer-readable media 134 further includes the thermal management engine 140 or, more specifically, computer-readable instructions that are executable by the processing units 132 to implement functionalities described herein in relation to the thermal management engine 140. The components of the HMD device 100 are operatively connected, for example, via a bus 142, which can include one or more of a system bus, a data bus, an address bus, a PCI bus, a Mini-PCI bus, and any variety of local, peripheral, and/or independent buses.

The processing unit(s) 130, can represent, for example, a CPU-type processing unit, a GPU-type processing unit, a field-programmable gate array (FPGA), another class of digital signal processor (DSP), or other hardware logic components that may, in some instances, be driven by a CPU. For example, and without limitation, illustrative types of hardware logic components that can be used include Application-Specific Integrated Circuits (ASICs), Application-Specific Standard Products (ASSPs), System-on-a-Chip Systems (SOCs), Complex Programmable Logic Devices (CPLDs), etc.

As used herein, computer-readable media, such as computer-readable media 134, can store instructions executable by the processing unit(s) 132. Computer-readable media can also store instructions executable by external processing units such as by an external CPU, an external GPU, and/or executable by an external accelerator, such as an FPGA type accelerator, a DSP type accelerator, or any other internal or external accelerator.

Computer-readable media can include computer storage media and/or communication media. Computer storage media can include one or more of volatile memory, non-volatile memory, and/or other persistent and/or auxiliary computer storage media, removable and non-removable computer storage media implemented in any method or technology for storage of information such as computer-readable instructions, data structures, program modules, or other data. Thus, computer storage media includes tangible and/or physical forms of media included in a device and/or hardware component that is part of a device or external to a device, including but not limited to random access memory (RAM), static random-access memory (SRAM), dynamic random-access memory (DRAM), phase change memory (PCM), read-only memory (ROM), erasable programmable read-only memory (EPROM), electrically erasable programmable read-only memory (EEPROM), flash memory, rotating media, optical cards or other optical storage media, magnetic storage, magnetic cards or other magnetic storage devices or media, solid-state memory devices, storage arrays, network attached storage, storage area networks, hosted computer storage or any other storage memory, storage device, and/or storage medium that can be used to store and maintain information for access by a computing device.

In contrast to computer storage media, communication media can embody computer-readable instructions, data structures, program modules, or other data in a modulated data signal, such as a carrier wave, or other transmission mechanism. As defined herein, computer storage media does not include communication media. That is, computer storage media does not include communications media consisting solely of a modulated data signal, a carrier wave, or a propagated signal, per se.

As described above, the thermal management engine 140 manages how electrical power is distributed (e.g., directed and/or routed) from the photovoltaic cells 102 based on current state data 138. In some embodiments, the current state data 138 may be indicative of current-state factors of the HMD device 100 which may be updated in real time and/or near real-time (e.g., updated every one second, five seconds, 15 seconds, or at some other near real-time interval). For purposes of the present discussion, presume that the current-state factors include a current power demand of the HMD device 100, a current charge level of the battery 118, and/or a current temperature at one or more temperature sensors that are incorporated within the HMD device 100 at various locations.

As illustrated, the HMD device 100 also includes the heating device 128 embedded within the support element 114 at a location that is remote from the housing assembly 106. For purposes of the present discussion, presume that the thermal management engine 140 is operable to distribute electrical power generated by the photovoltaic cells 102 to perform the functions of: (i) supplying power to one or more electrical components (e.g., CPUs and/or GPU's) of the HMD device 100, (ii) charging the battery 118, and (iii) supplying power to the heating device 128.

In some embodiments, the thermal management engine 140 may monitor current power demand (e.g., measured in Watts) of the electronic components of the HMD device 100 and may direct at least some electrical current from the photovoltaic cells 102 to these electronics to meet this current power demand. In this way, the HMD device 100 exploits photovoltaic effects to both reduce the solar gain experienced by the housing assembly 106 while simultaneously reducing the drain on the battery 118.

In some embodiments, the thermal management engine 140 may monitor a current battery level (e.g., measured in Volts) of the battery 118 and may direct at least some electrical current from the photovoltaic cells 102 to the battery 118 to increase the current battery level (e.g., to increase the voltage of the battery 118). In this way, the HMD device 100 exploits photovoltaic effects to both reduce the solar gain experienced by the housing assembly 106 while simultaneously charging the battery 118.

In some embodiments, the thermal management engine 140 may direct at least some electrical current from the photovoltaic cells 102 to the heating device 128. Presuming that the heating device 128 is a resistive heating element that performs Joule heating when supplied with electrical current, it will be appreciated that supplying electrical current to the heating device 128 will result in electrical energy being converted to thermal energy remotely from where the electrical energy was photovoltaically generated. As described in more detail in relation to FIG. 4, in some embodiments the heating device 128 may be a thermoelectric cooler (TEC) that "pumps" heat out of a housing assembly of a wearable electronic device.

Turning now to FIG. 1B, illustrated is the exemplary HMD device 100 of FIG. 1A after the flexible solar sheet 118 has been adhered directly to the outer surface 104 of the housing assembly 106. As illustrated, the first aperture 126(1) of the flexible solar sheet 118 substantially matches an outer profile of the first aperture 120(1) of the outer shell 104. As further illustrated, the second aperture 126(2) of the flexible solar sheet 118 substantially matches an outer profile of the second aperture 120(2) of the outer shell 104. In this way, the first aperture 126(1) of the flexible solar sheet 118 prevents interference with the thermal function of the first aperture 120(1) of the outer shell 104 whereas the second aperture 126(2) of the flexible solar sheet 118 prevents blockage of the user input device 122 that protrudes from the outer shell 104.

As shown in FIG. 1B, incident solar radiation is shown to be striking the photovoltaic cells 102. For purposes of the present discussion, presume that the amount of incident solar radiation that strikes the photovoltaic cells 102 is 10 Watts. It should be appreciated that this specific wattage value is arbitrarily selected to assist with conveying the concepts described herein. During real-life operation, more or less wattage of incident solar radiation may strike the photovoltaic cells 102. For purposes of the present discussion, further presume that the power conversion efficiency (PCE) of the photovoltaic cells 102 is 0.2 (or 20%) such that 20% of the incident solar power that strikes the photovoltaic cells 102 is converted into useful output electrical power. Thus, under the currently presumed conditions, the photovoltaic cells 102 are generating 2 Watts of electrical power output. Since this 2 Watts is converted to electrical power output rather than being absorbed by the housing assembly 106 in the form of heat, the presence of the photovoltaic cells 102 in the specifically illustrated example reduces the solar gain experienced by the housing assembly 106 by 2 Watts. This reduction in solar gain may result in the housing assembly 106 being able to dissipate an additional 2 Watts of internally emitted heat.

As further illustrated, at least some of the 2 Watts of electrical power that is generated by the photovoltaic cells 102 is transmitted through one or more wires 150 (as represented by the current symbol "$i$") into the heating device 128. The one or more wires 150 may be integrated into the support element 114. For example, the one or more wires 150 may be embedded within the support element 114 and/or may be affixed to an outer surface of the support element 114. In the illustrated embodiment, the heating device 128 then converts this electrical power into heat which is then dissipated into the ambient environment as represented by several heat flux vectors that are individually labeled $\vec{q}$.

Figure 2A:
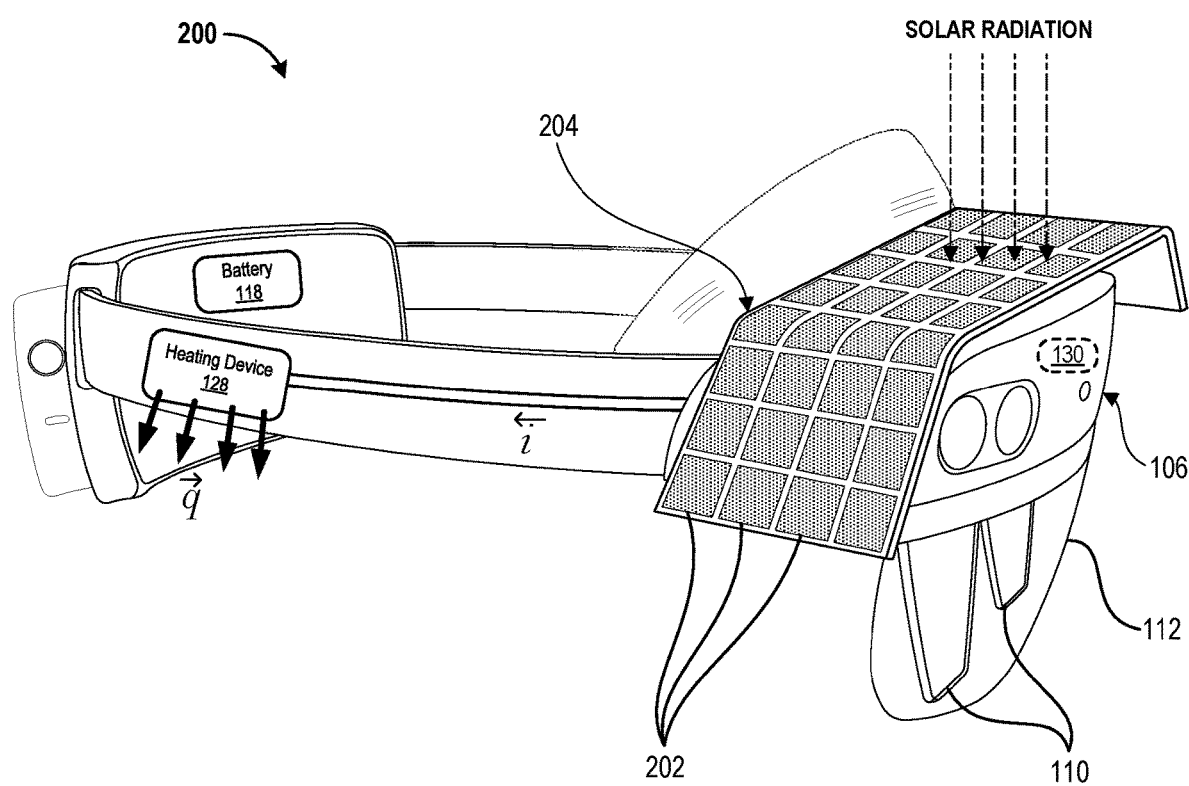
FIG. 2A illustrates an alternate embodiment of an HMD device that is configured with a shade element having photovoltaic cells disposed thereon to exploit photovoltaic effects for improved thermal management capabilities.

Turning now to FIG. 2A, illustrated is an alternate embodiment of an HMD device 200 that is configured to exploit photovoltaic effects for improved thermal management capabilities. As illustrated, the HMD device 200 includes a plurality of photovoltaic cells 202 that are disposed over a shade element 204 (which may be at least partially rigid) that is at least partially separated from the housing assembly 106. The separation of the shade element 204 from the housing assembly 106 provides an air gap between the photovoltaic cells 202, which are stricken with the incident solar radiation, and the housing assembly 106. In this way, the shade element 204 may reduce the solar gain experienced by the housing assembly 106 to an extent that is even greater than the power conversion efficiency (PCE) of the photovoltaic cells 202. In particular, although the HMD device 200 as a whole will experience an overall reduction in solar gain that is largely dependent on the PCE (as described in relation to FIG. 1B), a portion of this overall solar gain which results from incident solar radiation striking the shade element 204 will be at least partially isolated from the housing assembly 106. Furthermore, the air gap that exists between shade element 204 and the housing assembly 106 facilitates airflow between the region of the HMD device 200 at which the temperature increases due to solar gain (i.e., the shade element 204) and the region of the HMD device 200 at which the electronic components generate heat during operation.

Figure 2B:
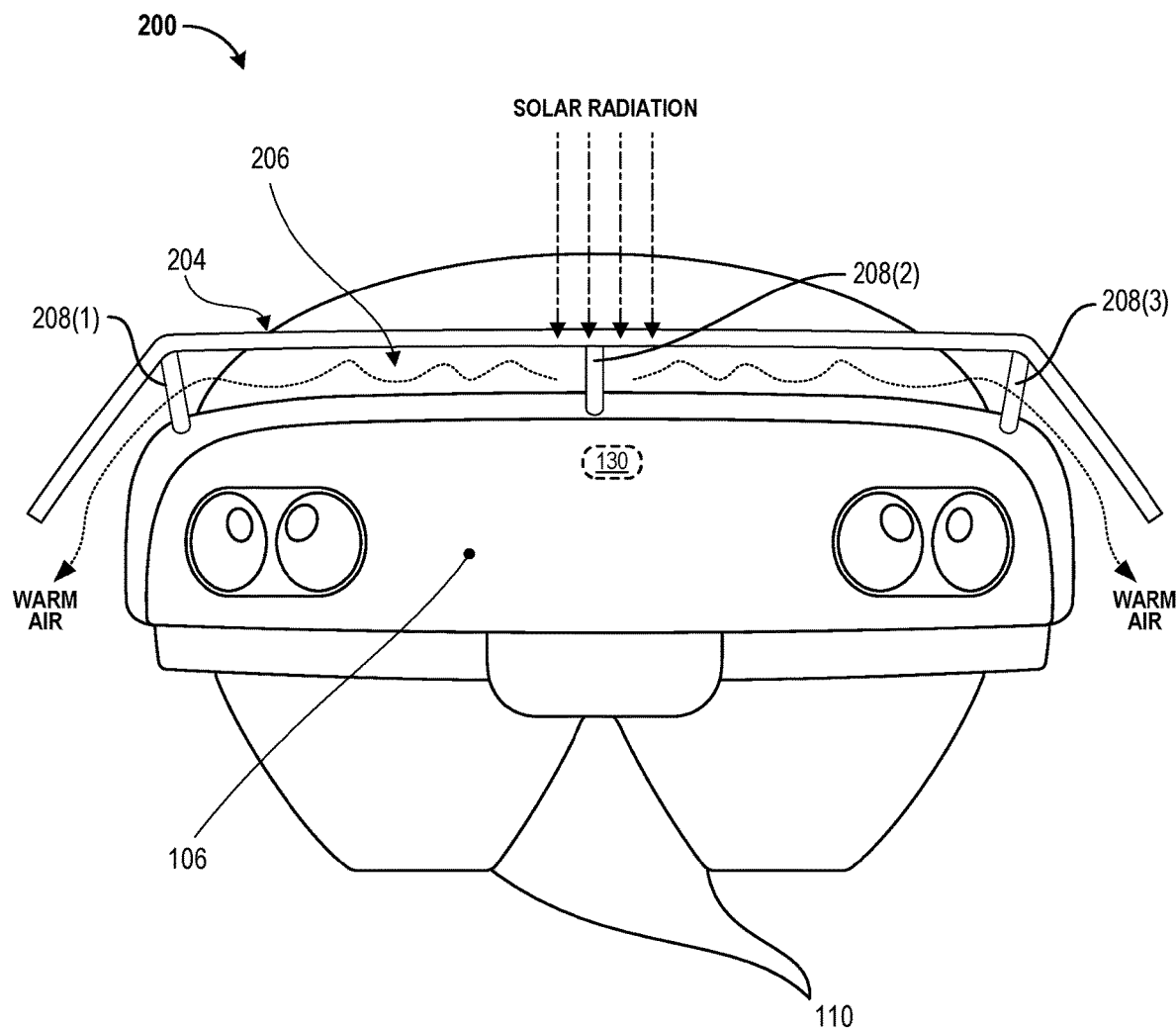
FIG. 2B is a front view of the HMD device of FIG. 2A that shows an air gap between the shade element on which the photovoltaic cells are disposed and a housing assembly within which electronic components are enclosed.

FIG. 2B is a front view of the HMD device 200 of FIG. 2A that shows an air gap 206 between the shade element 204 on which photovoltaic cells 202 are disposed and the housing assembly 106 within which one or more electronic components are enclosed. As illustrated, the shade element 204 is mechanically coupled to the HMD device 200 via one or more standoff supports 208. It can be appreciated that the height of the airgap 206 is defined by the length of the one or more standoff supports 208. It can also be appreciated from FIG. 2B that as solar radiation strikes the shade element 204, the effects of solar gain will increase the thermal energy of the shade element 204—rather than the housing assembly 106. The shade element 204 will then dissipate this thermal energy both radiatively and convectively into an ambient environment. As illustrated, some portion of the convectively dissipated thermal energy will be carried through the airgap 206 in a stream of warm air.

In some embodiments, the shade element 204 may be removably coupled to the HMD device 200 such that a user may readily attach and detach the shade element 204 from one or more components of the HMD device 200 such as, for example, the housing assembly 206. Such embodiments may be particularly useful in circumstances where the HMD device 200 is worn under continually changing environmental conditions. For example, under nighttime conditions were a little or no solar radiation strikes the HMD device 200, a user may choose to utilize the HMD device 200 without the shade element 204, e.g., to reduce the bulkiness of the product. The, subsequent to the sun rising, the user may then choose to attach the shade element 204 to the HMD device 200 in order to exploit photovoltaic effects for improved thermal performance of the HMD device 200.

Figure 3:
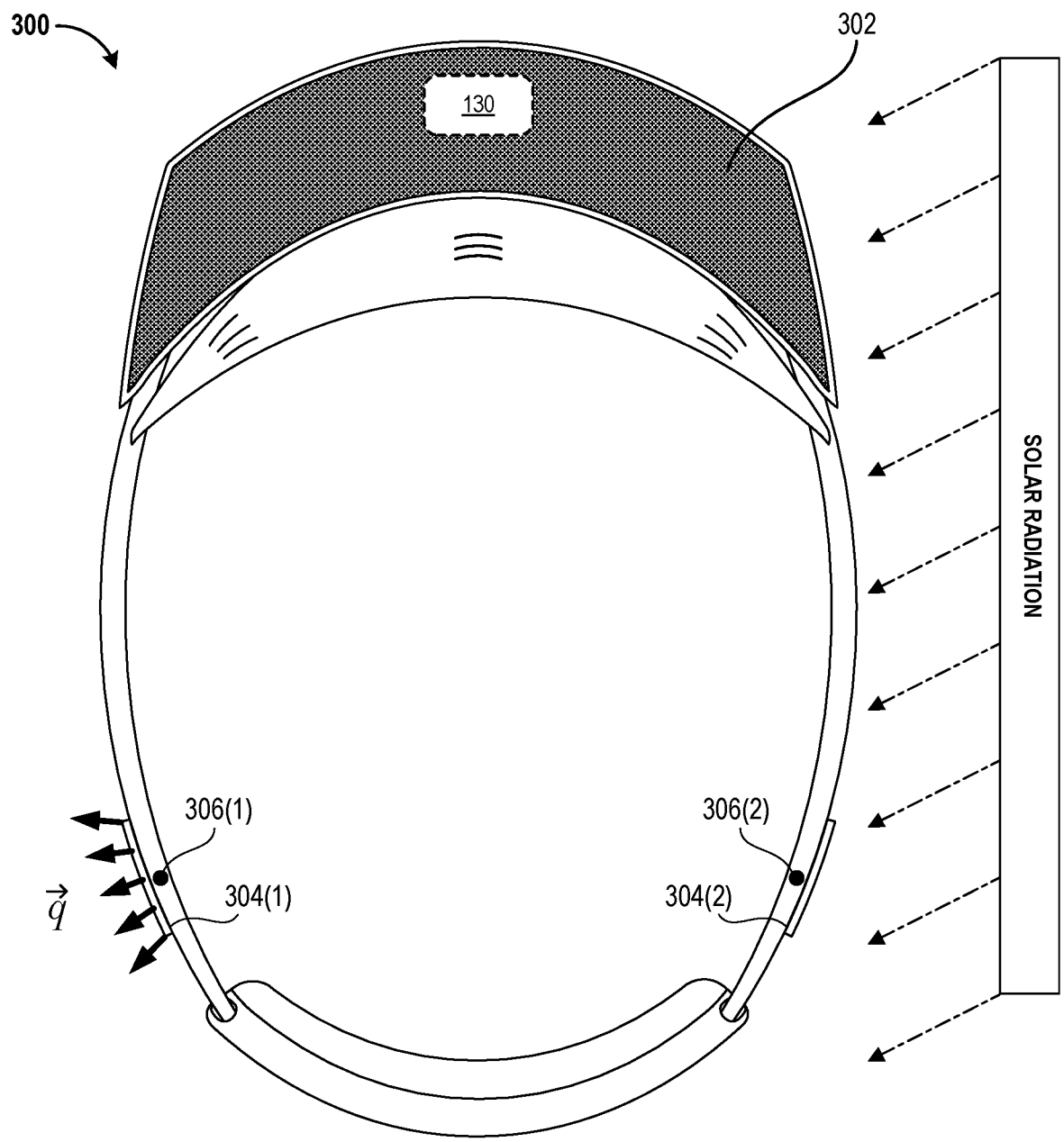
FIG. 3 illustrates an exemplary wearable electronic device that includes a photovoltaic region that is electrically coupled to a plurality of heating devices.

Turning now to FIG. 3, illustrated is an exemplary wearable electronic device 300 that includes at least one photovoltaic region 302 that is electrically coupled to a plurality of heating devices 304. As illustrated, the wearable electronic device 300 includes a first heating device 304(1) that is positioned adjacent to a first temperature sensor 306(1). As further illustrated, the wearable electronic device 300 includes a second heating device 304(2) that is positioned adjacent to a second temperature sensor 306(2). As described above, exemplary heating devices 306 may be resistive element heaters that perform Joule heating when supplied with electric power.

In the illustrated example solar radiation is shown to be predominantly striking the right side of the wearable electronic device 300. They will be appreciated that for this reason the right side the wearable electronic device 300 his subjected to a greater degree of solar gain than the left side of the wearable electronic device 300. Thus, for purposes of the discussion of FIG. 3, presume that the direction from which the solar radiation is shown to irradiate the wearable electronic device results in the right side of the wearable electronic device 300 having a higher temperature than the left side.

Under these circumstances, the wearable electronic device 300 may direct a greater amount of electrical current that is generated at the photovoltaic region 302 to the first heating device 304(1) that is located on the left side (e.g., the cooler side) of the wearable electronic device 300. For example, the wearable electronic device 300 may include a controller 130 that implements the thermal management engine 140 described above to manage how electrical power is distributed from the photovoltaic region 302 to the different heating devices 304 based on current temperature data that is collected from the individual temperature sensors 306. In this way, the thermal management engine 140 may actively modulate how much electrical current flows from the photovoltaic region 302 to individual ones of the heating devices 304 so as to maintain acceptable surface temperatures across the entire wearable electronic device 300.

To illustrate this point, suppose that the maximum allowable surface temperature of the wearable electronic device 300 is 40° C. Further suppose that due to the solar radiation predominantly striking the right side of the wearable electronic device 300, the current temperature reading obtained from the second temperature sensor 306(2) it is 39.5° C. whereas the current temperature reading obtained from the first temperature sensor 306(1) is a substantially cooler 30° C. It will be appreciated that under these circumstances directing electrical power to the second heating device 304(2) could potentially result in higher than allowable surface temperatures. Thus, based on the current-state data 138 (which in this case includes readings from the temperature sensors 306), the thermal management engine 140 directs all or substantially all of the electrical power that is generated within the photovoltaic region 302 to the first heating device 304(1).

Figure 4:
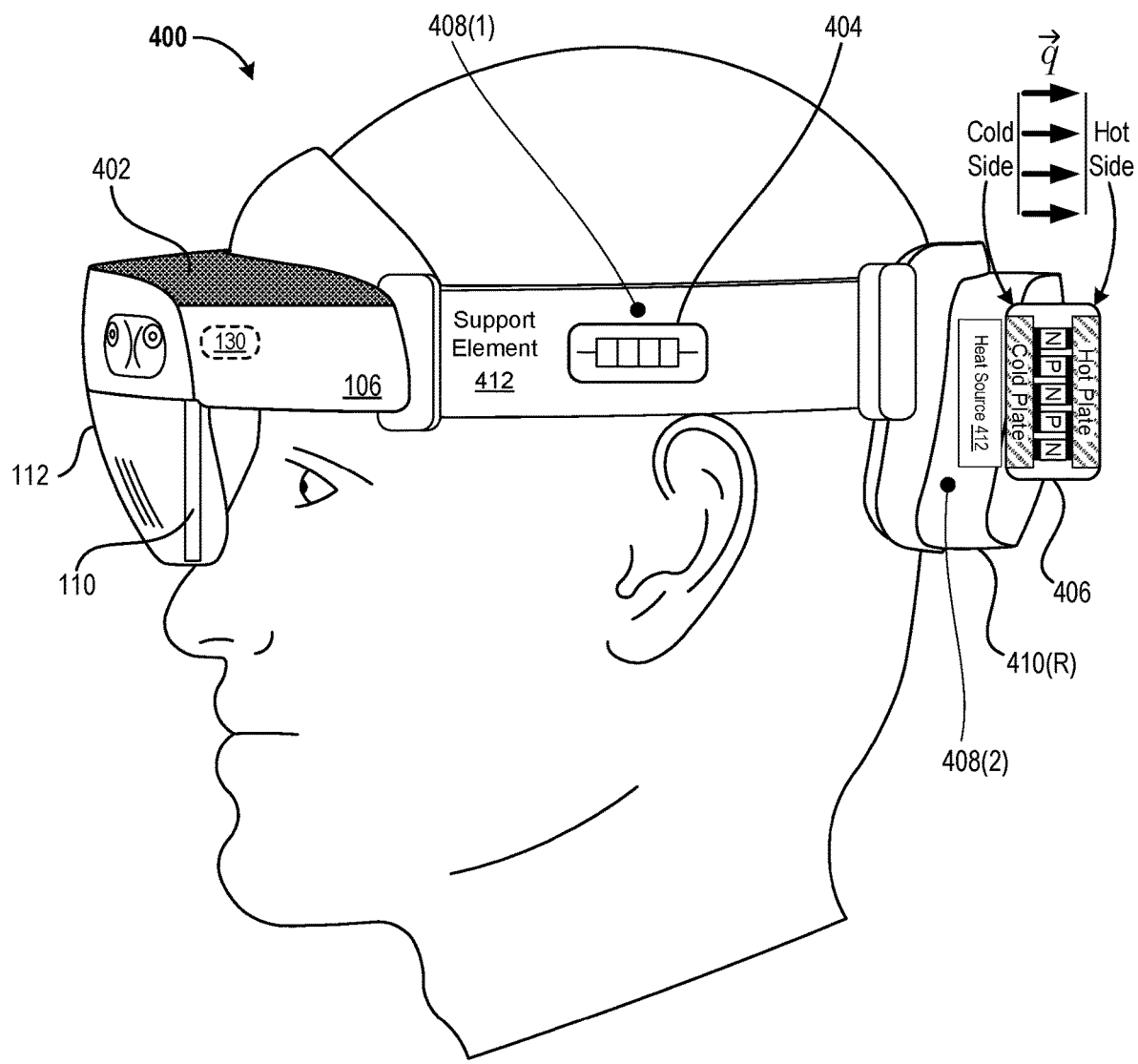
FIG. 4 illustrates an exemplary wearable electronic device that includes a photovoltaic region that is electrically coupled to a resistive heating element as well as a heat pump.

Turning now to FIG. 4, illustrated is an exemplary wearable electronic device 400 (shown in the form of an HMD device) that includes a photovoltaic region 402 that is electrically coupled to a resistive heating element 404 as well as a heat pump 406. Exemplary heat pumps 406 may include, but are not limited to, thermoelectric cooler (TEC) type heat pumps that utilize the Peltier effect create a heat flux at a junction between two different types of materials. In this way, the heat pump 406 may be a solid-state active heat pump which transfers heat from one side of the device to the other side of the device when an electrical current is applied thereto.

As illustrated, the heat pump 406 at least partially protrudes through the rear housing assembly 410(R) that encloses a heat source 412. Furthermore, the heat pump 406 includes a cold side and a hot side that is opposite the cold side. As illustrated, the cold side of the heat pump 406 is positioned relatively closer to the heat source 412 than the hot side of the heat pump 406. Application of electric current in a particular direction to the heat pump 406, therefore, efficiently transfers heat that is emitted by the heat source 412 within the rear housing assembly 410(R) to an ambient environment, i.e., outside of the rear housing assembly 410(R). The heat pump 406 is shown in FIG. 4 to include alternating P-type and N-type semiconductor materials. It should be appreciated that this specific configuration is shown for illustrative purposes only and that other suitable types of heat pumps 406 may also be utilized to implement the techniques disclosed herein.

In some embodiments, the wearable electronic device 400 may modulate how much current is supplied to the resistive heating element 404 and/or the heat pump 406 based on the current-state data 138 that is indicative of one or more current conditions of the wearable electronic device 400. For example, as illustrated, the wearable electronic device 400 includes a first temperature sensor 408(1) that is positioned near the resistive heating element 404 as well as a second temperature sensor 408(2) that is positioned near the heat source 412. Based on most recent temperature readings received from one or both of the first and second temperature sensors 408, the controller 130 may implement the thermal management engine 140 as described herein to modulate how much current is supplied to the resistive heating element 404 versus the heat pump 406.

As a specific example, suppose that the maximum allowable internal temperature for the rear housing 410(R) is 50° C. and that above this temperature the performance of the wearable electronic device 400 may be impaired. Further suppose that the most recent temperature reading received from the second temperature sensor 408(2) indicates that the internal temperature of the rear housing 410(R) is 49° C. Under these circumstances, the thermal management engine 140 may determine an amount of electrical power to supply to the heat pump 406 from the photovoltaic region 402 based a comparison of the known maximum allowable internal temperature of 50° C. for the rear housing 410(R) to the most recent reading of 49° C. from the second temperature sensor 408(2). For example, based on the current temperature within the rear housing 410(R) being very close to the maximum allowable temperature, the thermal management engine 140 may bias electrical power from the photovoltaic cells of the wearable electronic device 400 into the heat pump 406 for the specific purpose of cooling down the internal region of the rear housing 410(R).

As another specific example, suppose that the maximum allowable external temperature for the wearable electronic device 400 is 40° C. and that above this temperature a user may be burned and/or experience thermal discomfort. Further suppose that the most recent temperature reading received from the first temperature sensor 408(1) indicates that the external temperature of the support element 412 is 39.5° C. Under these circumstances, the thermal management engine 140 may determine an amount of electrical power to supply to the resistive heating element 404 from the photovoltaic region 402 based on a comparison of the known maximum allowable external temperature of 40° for the support element 412 to the most recent reading of 39.5° C. from the first temperature sensor 408(1). For example, based on the current temperature of the support element 412 being very close to its maximum allowable external temperature, the thermal management engine may restrict the resistive heating element 404 from receiving any electrical power whatsoever that is currently being generated by the photovoltaic cells of the wearable electronic device 400.

Figure 5:
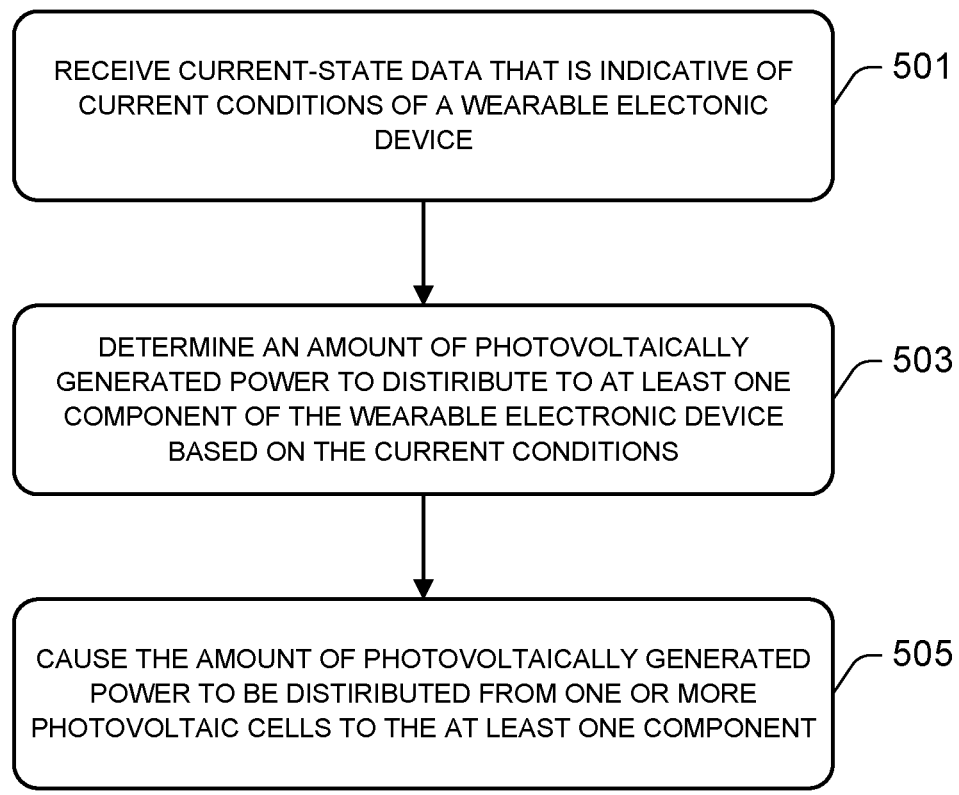
FIG. 5 is a flow diagram of a process to determine how to distribute photovoltaically-generated electrical power between various components of a wearable electronic device.

Turning now to FIG. 5, a flow diagram is illustrated of a process 500 to determine how to distribute photovoltaically-generated electrical power between various components of a wearable electronic device. In an exemplary embodiment, the process 500 may be implemented by the thermal management engine 140 to control how electrical power is distributed from the photovoltaic cells 102 to one or more of the heating device 128, the battery 118, and/or various computing components such as the processing unit(s) 132. The process 500 is described with reference to FIGS. 1A-4. The process 500 is illustrated as a collection of blocks in a logical flow graph, which represent a sequence of operations that can be implemented in hardware, software, or a combination thereof. In the context of software, the blocks represent computer-executable instructions that, when executed by one or more processors, perform the recited operations. Generally, computer-executable instructions include routines, programs, objects, components, data structures, and the like that perform or implement particular functions. The order in which operations are described is not intended to be construed as a limitation, and any number of the described blocks can be combined in any order and/or in parallel to implement the process. Other processes described throughout this disclosure shall be interpreted accordingly.

At block 501, a system receives current-state data that is indicative of one or more current conditions of a wearable electronic device. In various embodiments, the current-state data may be indicative of a current power demand of the electronic components within the wearable electronic device, a current charge level of a battery within the wearable electronic device, and/or a current temperature at one or more sensors of the wearable electronic device. For example, the wearable electronic device may monitor current power demand (e.g., measured in Watts) of the electronic components within the housing assembly so that a first amount of current may be directed from the photovoltaic cells to these electronics to meet this current power demand—thereby reducing the drain on a battery of the wearable electronic device. As another example, the wearable electronic device may monitor current temperatures at one or sensors so that current may be directed toward heating elements at which the current temperature is below a predetermined temperature threshold.

At block 503, the system determines an amount of photovoltaically generated electrical power to distribute to at least one component of the wearable electronic device based on the current conditions of the wearable electronic device. For example, as described above, the system may determine an amount of power to supply to the electronic components to meet the current power demand thereof. Then, the system may further determine an amount of power to supply to one or more heating elements based on current temperature readings taken near these heating elements. For example, a greater amount of power may be directed toward heating elements that are not within some threshold temperature from a maximum allowable temperature. As specifically described in relation to FIG. 3, if the maximum allowable surface temperature of the wearable electronic device is 40° C., and a current temperature reading obtained near a second heating element 304(2) is 39.5° C. whereas a current temperature reading obtained from near a first heating element is a substantially cooler 30° C., the system may direct some electrical power from the photovoltaic cells to the first heating element to generate heat for dissipation from the wearable electronic device but may refrain from directing any of this electrical power to the second heating element.

At block 505, the system causes the determined amount of photovoltaically generated electrical power to be distributed to at least one component of the wearable electronic device. For example, as described above, the system may direct an appropriate amount of power into the housing to meet a current power demand of the enclosed electronics while directing some other amount of power to a particular heating element that is determined to be an acceptable current temperature such that is can be heated without exceeding maximum allowable temperatures. As another example, in response to a temperature measurement taken within a housing assembly that encloses a heat source reaching or exceeding a threshold, photovoltaically generated power may be routed to a thermoelectric cooler or other suitable type of heat pump to pump heat that is being emitted by the heat source out of the housing assembly.

It should be appreciated any reference to "first," "second," etc. items and/or abstract concepts within the description is not intended to and should not be construed to necessarily correspond to any reference of "first," "second," etc. elements of the claims. In particular, within this Detailed Description and/or the previous Summary, items and/or abstract concepts such as, for example, heating devices and/or housing assemblies may be distinguished by numerical designations without such designations corresponding to the claims or even other paragraphs of the Summary and/or Detailed Description. For example, any designation of a "first heating device" and "second heating device" within a paragraph of this disclosure is used solely to distinguish two different wave heating device within that specific paragraph—not any other paragraph and particularly not the claims.

Example Clauses

The disclosure presented herein may be considered in view of the following clauses.

Example Clause A, a head-mounted display device, comprising: a display to generate imagery within a field-of-view of a user; a housing assembly having an outer shell that at least partially encloses one or more computing components that emit heat during operation, wherein the housing assembly is mechanically coupled to the display to support the display within the field-of-view of the user; a support element that is mechanically coupled to the housing assembly to enable the housing assembly to be mounted to a head of the user to maintain the display within the field-of-view of the user; and one or more photovoltaic cells that are mechanically coupled to the housing assembly that at least partially encloses the one or more computing components that emit heat during operation, wherein the one or more photovoltaic cells are positioned to reduce a solar gain of the housing assembly by blocking solar radiation from at least a portion of the outer shell of the housing assembly.

Example Clause B, the head-mounted display device of Example Clause A, further comprising a heating device that is electrically coupled to the one or more photovoltaic cells.

Example Clause C, the head-mounted display device of any one of Example Clauses A through B, wherein the heating device converts electrical energy, that is generated by the one or more photovoltaic cells from the solar radiation that is blocked from the portion of the outer shell of the housing assembly, into thermal energy at location that is remote from the housing assembly.

Example Clause D, the head-mounted display device of any one of Example Clauses A through C, wherein the heating device is a thermoelectric cooler (TEC) having a cold side that is directed toward a heat source and a hot side that is directed away from the heat source.

Example Clause E, the head-mounted display device of any one of Example Clauses A through D, further comprising a controller that is configured with computer-readable instructions that are executable to implement a thermal management engine that selectively distributes a flow of current from the one or more photovoltaic cells to a plurality of components based on current-state data associated with the head-mounted display device.

Example Clause F, the head-mounted display device of any one of Example Clauses A through E, wherein the current-state data is indicative of at least one of: a current power demand of the one or more computing components, a current charge level of a battery, or a current temperature at one or more sensors.

Example Clause G, the head-mounted display device of any one of Example Clauses A through F, wherein the plurality of components includes at least: the one or more computing components that are enclosed within the housing assembly, and a heating device that is noncontiguous with the housing assembly.

Example Clause H, the head-mounted display device of any one of Example Clauses A through G, further comprising: a shade element that is at least partially separated from the housing assembly to form an air gap between the portion of the outer shell of the housing assembly and a bottom surface of the shade element, wherein the one or more photovoltaic cells are disposed over a top surface of the shade element.

Example Clause I, a wearable electronic device comprising: a housing assembly having an outer shell that at least partially encloses one or more computing components that emit heat during operation; a support element to mechanically couple the housing assembly to a body part of a user; one or more photovoltaic cells disposed over the outer shell of the housing assembly; and a heating device electrically coupled to the one or more photovoltaic cells via one or more wires that are integrated into the support element.

Example Clause J, the wearable electronic device of Example Clause I, wherein the heating device is a resistive heating element that is embedded within the support element.

Example Clause K, the wearable electronic device of any one of Example Clauses I through J, wherein the heating device is a thermoelectric cooler (TEC) having a cold side that is directed toward a heat source and a side that is directed away from the heat source.

Example Clause L, the wearable electronic device of any one of Example Clauses I through K, further comprising a controller that determines an amount of current to supply from the one or more photovoltaic cells to the heating device based on current-state data associated with the wearable electronic device.

Example Clause M, the wearable electronic device of any one of Example Clauses I through L, wherein the current-state data is indicative of at least a current power demand of the one or more computing components.

Example Clause N, the wearable electronic device of any one of Example Clauses I through M, wherein the current-state data is indicative of at least a current temperature at one or more temperature sensors that are located adjacent to the heating device.

Example Clause O, a wearable electronic device, comprising: a housing assembly having an outer shell that at least partially encloses one or more computing components that emit heat during operation; one or more photovoltaic cells that are positioned to reduce a solar gain of the housing assembly by blocking solar radiation from at least a portion of the outer shell of the housing assembly; and at least one controller that is configured to: receive current-state data that is indicative of one or more current conditions of the wearable electronic device; determine, based on the current-state data, an amount of electrical power that is generated by the one or more photovoltaic cells to distribute to at least one component of the wearable electronic device; and cause the amount of the electrical power to be distributed from the one or more photovoltaic cells to the at least one component of the wearable electronic device.

Example Clause P, the wearable electronic device of Example Clause O, wherein the at least one component is a heating device, and wherein current-state data is indicative of a current temperature measurement that is obtained from a sensor that is located adjacent to the heating device.

Example Clause Q, the wearable electronic device of any one of Example Clauses O through P, wherein the controller is configured to prevent the electrical power from being distributed from the one or more photovoltaic cells to the heating device in response to the current temperature measurement exceeding a threshold temperature.

Example Clause R, the wearable electronic device of any one of Example Clauses O through Q, wherein the at least one component is the one or more one or more computing components that are enclosed within the outer shell of the housing assembly, and wherein current-state data is indicative of a current power demand of the one or more computing components.

Example Clause S, the wearable electronic device of any one of Example Clauses O through R, wherein the at least one component is a thermoelectric cooler (TEC) that is electrically coupled to the one or more photovoltaic cells.

Example Clause T, the wearable electronic device of any one of Example Clauses O through S, wherein the current-state data is indicative of at least: a current power demand of the one or more computing components, a current charge level of a battery, and a current temperature at one or more sensors.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A head-mounted display device, comprising:
   a display to generate imagery within a field-of-view of a user;
   a housing assembly having an outer shell that at least partially encloses one or more computing components that emit heat during operation, wherein the housing assembly is mechanically coupled to the display to support the display within the field-of-view of the user;
   a support element that is mechanically coupled to the housing assembly to enable the housing assembly to be mounted to a head of the user to maintain the display within the field-of-view of the user; and
   one or more photovoltaic cells that are mechanically coupled to the housing assembly that at least partially encloses the one or more computing components that emit heat during operation, wherein the one or more photovoltaic cells are positioned to reduce a solar gain of the housing assembly by blocking solar radiation from at least a portion of the outer shell of the housing assembly.

2. The head-mounted display device of claim 1, further comprising a heating device that is electrically coupled to the one or more photovoltaic cells.

3. The head-mounted display device of claim 2, wherein the heating device converts electrical energy, that is generated by the one or more photovoltaic cells from the solar radiation that is blocked from the portion of the outer shell of the housing assembly, into thermal energy at location that is remote from the housing assembly.

4. The head-mounted display device of claim 2, wherein the heating device is a thermoelectric cooler (TEC) having a cold side that is directed toward a heat source and a hot side that is directed away from the heat source.

5. The head-mounted display device of claim 1, further comprising a controller that is configured with computer-readable instructions that are executable to implement a thermal management engine that selectively distributes a flow of current from the one or more photovoltaic cells to a plurality of components based on current-state data associated with the head-mounted display device.

6. The head-mounted display device of claim 5, wherein the current-state data is indicative of at least one of:
   a current power demand of the one or more computing components,
   a current charge level of a battery, or
   a current temperature at one or more sensors.

7. The head-mounted display device of claim 5, wherein the plurality of components includes at least:
   the one or more computing components that are enclosed within the housing assembly, and
   a heating device that is noncontiguous with the housing assembly.

8. The head-mounted display device of claim 1, further comprising:
   a shade element that is at least partially separated from the housing assembly to form an air gap between the portion of the outer shell of the housing assembly and a bottom surface of the shade element, wherein the one or more photovoltaic cells are disposed over a top surface of the shade element.

9. A wearable electronic device comprising:
a housing assembly having an outer shell that at least partially encloses one or more computing components that emit heat during operation;
a support element to mechanically couple the housing assembly to a body part of a user;
one or more photovoltaic cells disposed over the outer shell of the housing assembly; and
a heating device electrically coupled to the one or more photovoltaic cells via one or more wires that are integrated into the support element.

10. The wearable electronic device of claim 9, wherein the heating device is a resistive heating element that is embedded within the support element.

11. The wearable electronic device of claim 9, wherein the heating device is a thermoelectric cooler (TEC) having a cold side that is directed toward a heat source and a hot side that is directed away from the heat source.

12. The wearable electronic device of claim 9, further comprising a controller that determines an amount of current to supply from the one or more photovoltaic cells to the heating device based on current-state data associated with the wearable electronic device.

13. The wearable electronic device of claim 12, wherein the current-state data is indicative of at least a current power demand of the one or more computing components.

14. The wearable electronic device of claim 12, wherein the current-state data is indicative of at least a current temperature at one or more temperature sensors that are located adjacent to the heating device.

15. A wearable electronic device, comprising:
a housing assembly having an outer shell that at least partially encloses one or more computing components that emit heat during operation;
one or more photovoltaic cells that are positioned to reduce a solar gain of the housing assembly by blocking solar radiation from at least a portion of the outer shell of the housing assembly; and
at least one controller that is configured to:
receive current-state data that is indicative of one or more current conditions of the wearable electronic device;
determine, based on the current-state data, an amount of electrical power that is generated by the one or more photovoltaic cells to distribute to at least one component of the wearable electronic device; and
cause the amount of the electrical power to be distributed from the one or more photovoltaic cells to the at least one component of the wearable electronic device.

16. The wearable electronic device of claim 15, wherein the at least one component is a heating device, and wherein current-state data is indicative of a current temperature measurement that is obtained from a sensor that is located adjacent to the heating device.

17. The wearable electronic device of claim 16, wherein the controller is configured to prevent the electrical power from being distributed from the one or more photovoltaic cells to the heating device in response to the current temperature measurement exceeding a threshold temperature.

18. The wearable electronic device of claim 15, wherein the at least one component is the one or more one or more computing components that are enclosed within the outer shell of the housing assembly, and wherein current-state data is indicative of a current power demand of the one or more computing components.

19. The wearable electronic device of claim 15, wherein the at least one component is a thermoelectric cooler (TEC) that is electrically coupled to the one or more photovoltaic cells.

20. The wearable electronic device of claim 15, wherein the current-state data is indicative of at least: a current power demand of the one or more computing components, a current charge level of a battery, and a current temperature at one or more sensors.

* * * * *